(12) United States Patent
Matsumoto et al.

(10) Patent No.: US 7,528,637 B2
(45) Date of Patent: May 5, 2009

(54) DRIVER CIRCUIT

(75) Inventors: Naoki Matsumoto, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 4 days.

(21) Appl. No.: 11/495,144

(22) Filed: Jul. 28, 2006

(65) Prior Publication Data
US 2007/0001717 A1 Jan. 4, 2007

Related U.S. Application Data

(63) Continuation of application No. PCT/JP2004/003041, filed on Mar. 9, 2004.

(30) Foreign Application Priority Data

Jan. 30, 2004 (JP) .............................. 2004-024464

(51) Int. Cl.
*H03K 3/00* (2006.01)
(52) U.S. Cl. ........................ 327/112; 327/538; 327/560; 327/63
(58) Field of Classification Search ................. 327/108, 327/112
See application file for complete search history.

(56) References Cited

U.S. PATENT DOCUMENTS 5,377,202 A * 12/1994 Bryson et al. ................ 714/740
6,294,949 B1 * 9/2001 Kojima et al. ............... 327/538
2003/0231072 A1 * 12/2003 Mason .................... 331/117 R

FOREIGN PATENT DOCUMENTS

| JE | 6-77784 | 3/1994 |
| JP | 2001-57512 | 2/2001 |
| JP | 2004-30338 | 1/2004 |

OTHER PUBLICATIONS

International Search Report issued in International Application No. PCT/JP2004/003041 mailed on May 20, 2005, 2 pages.
Notification of Reason for Rejection issued in Japanese Application No. 2004-024464 mailed on Sep. 26, 2006 and English translation thereof, 4 pages.

* cited by examiner

*Primary Examiner*—Long Nguyen
*Assistant Examiner*—Ryan C Jager
(74) *Attorney, Agent, or Firm*—Osha • Liang LLP

(57) ABSTRACT

A driver circuit for outputting an output signal corresponding to an input signal given to the driver circuit, includes a voltage generating unit for outputting a basic output voltage corresponding to the input signal, a first buffer circuit for outputting an output voltage corresponding to the basic output voltage outputted by the voltage generating unit, a second buffer circuit, of which power consumption is larger than the first buffer circuit, for generating and outputting a voltage corresponding to the output voltage as the output signal, a simulating circuit including a simulating buffer circuit for generating a simulated voltage corresponding to the basic output voltage outputted by the voltage generating unit, the simulating buffer circuit having substantially the same characteristic as that of the first buffer circuit, and a controlling unit for controlling the basic output voltage outputted by the voltage generating unit based on the simulated voltage.

9 Claims, 8 Drawing Sheets

DRIVER CIRCUIT

CROSS REFERENCE TO RELATED APPLICATION

This is a continuation application of PCT/JP2004/003041 filed in PC on Mar. 9, 2004 which claims priority from a Japanese Patent Application No. JP 2004-024464 filed on Jan. 30, 2004, the contents of which are incorporated herein by reference.

BACKGROUND OF THE INVENTION

1. Field of the Invention

The present invention relates to a driver circuit for outputting an output signal in response to an input signal given to the driver circuit.

2. Related Art

As a conventional driver circuit for outputting an output signal in response to an input signal given to the driver circuit, a driver circuit 400 shown in FIG. 1 has been known. Predetermined voltages of H level $V_1$ and L level $V_2$ are given to buffer amplifiers 402 and 404 respectively to control CMOS switches 406 and 408 in response to a given input signal, and thereby either the output of the buffer amplifier 402 or 404 is supplied to a device under test DUT via an output resistor 410 and a transmission line 412.

In such CMOS switches (406 and 408), however, there is operating voltage dependence of resistance when the switch is turned on. Therefore, in the driver circuit 400 it is difficult for the output impedance to match the characteristic impedance of the transmission line 412. Although the impedance matching can be achieved by inserting a buffer circuit that can be operating at high speed to the next stage of the CMOS switches (406 and 408), if the buffer circuit is inserted, an error in the output voltage occurs due to the voltage offset and the voltage gain in the buffer circuit.

As a circuit to eliminate such error, a driver circuit 400 shown in FIG. 2 has been known as disclosed, for example, in Japanese Patent Application Laying-open No. 1994-77784. This driver circuit 400 is provided with a buffer circuit 420 and simulating buffer circuits (422 and 424) of the same characteristics, and allows the buffer circuit 420 to simulate both states of the H and L levels using the buffer circuits (422 and 424). Both output voltages of the buffer circuits (422 and 424) are fed back towards buffer amplifiers 402 and 404, so that the output voltage of the buffer circuit 420 can be controlled highly accurately.

However, since the device under test DUT is provided with a plurality of buffer circuits (422 and 424) of the same characteristics as the buffer circuit 420 that supplies the output voltage, the power consumption of the entire driver circuit 400 increases, and the size of the circuit is also large, which is not practical.

In addition, as a driver circuit not using any buffer circuit, a driver circuit using a differential switch has been known as disclosed, for example, in Japanese Patent Application Laying-open No. 2001-57512. The driver circuit controls its output voltage more accurately by generating its output voltage by allowing a current to flow through a resistor in the differential switch part, and controlling the current flowing through the differential switch part using the voltage of a current route that simulates the states of the differential switch. Even in the above circuit, however, the current consumption in the differential switch is increased if a signal of large amplitude is generated.

As described above, in the conventional driver circuits, it is difficult to control the output voltage highly accurately due to the impedance matching, the error of the voltage offset and the voltage gain in the buffer circuits. In addition, in case of controlling the output voltage highly accurately, the power consumption is increased, and therefore there is a problem that both the low power consumption and the highly accurate output voltage contradict each other.

SUMMARY OF THE INVENTION

An object of the present invention is to provide a driver circuit which is capable of solving the difficulties accompanying the conventional driver circuits.

In order to solve the problems above, according to the first aspect of the present invention, a driver circuit for outputting an output signal corresponding to an input signal given to the driver circuit, includes a voltage generating unit for outputting a basic output voltage corresponding to the input signal, a first buffer circuit for outputting an output voltage corresponding to the basic output voltage outputted by the voltage generating unit, a second buffer circuit, of which power consumption is larger than the first buffer circuit, for generating and outputting a voltage corresponding to the output voltage as the output signal, a simulating circuit including a simulating buffer circuit for generating a simulated voltage corresponding to the basic output voltage outputted by the voltage generating unit, the simulating buffer circuit having substantially the same characteristic as that of the first buffer circuit and a controlling unit for controlling the basic output voltage outputted by the voltage generating unit based on the simulated voltage.

The second buffer circuit may have less temperature dependence of outputted voltage than that of the first buffer circuit. In addition, the controlling unit may control the basic output voltage outputted by the voltage generating unit based on a differential between the simulated voltage and an expected value of the output voltage.

The first buffer circuit may be a common collector amplifier circuit, and the second buffer circuit may include an output transistor for generating the output signal corresponding to a voltage given to a gate thereof and a compensation transistor for supplying the gate of the output transistor with the voltage corresponding to the output voltage outputted by the first buffer circuit, the compensation transistor forming a complementary fair with the output transistor.

The voltage generating unit may include a current supply for generating a standard current, an output resistor, of which a first end is given a standard voltage of H level which is an expected value if the input signal indicates the H level, and a second end outputs the basic output voltage to the first buffer circuit, and a switch for preventing the standard current from flowing through the output resistor and supplying the standard voltage of H level to the first buffer circuit if the input signal indicates the H level, whereas the switch allows the standard current to flow through the output resistor and supplies a drop voltage equivalent to a voltage drop from the standard voltage of H level to the first buffer circuit if the input signal indicates an L level, the simulating circuit may include a first simulating buffer circuit for generating a first simulated voltage corresponding to the drop voltage, the first simulating buffer circuit having substantially the same characteristic as that of the first buffer circuit, and the controlling unit may include a first operational amplifier for controlling magnitude of the standard current generated by the current supply based on a differential between the first simulated voltage and a standard voltage of L level which is an expected value of the output voltage if the input signal indicates the L level.

The controlling unit may further include a second operational amplifier for supplying a voltage corresponding to the standard voltage of H level to the first end of the output resistor, when the standard voltage of H level is given, the simulating circuit may further include a second simulating buffer circuit for generating a second simulated voltage corresponding to the voltage given to the first end of the output resistor, the second simulating buffer circuit having substantially the same characteristic as that of the first buffer circuit, and the second operational amplifier may control the voltage given to the first end of the output resistor based on a differential between the second simulated voltage and the standard voltage of H level.

The simulating circuit may further include a reference current supply arranged in parallel to the current supply for generating a reference current, of which magnitude is 1/n (where n is a positive real number) times as much as that of the standard current and a reference resistor, of which resistance is n times as much as that of the output resistor, for generating a reference voltage substantially the same as the drop voltage when the reference current flows through the reference resistor, the reference resistor being arranged in parallel to the output resistor with regard to the second operational amplifier, the first simulating buffer circuit may generate the first simulated voltage corresponding to the reference voltage, and the controlling unit may further control magnitude of the reference current generated by the reference current supply based on the differential between the first simulated voltage and the standard voltage of L level.

The current supply may generate the standard current which is smaller than a first driving current. The voltage gains of the first and second buffer circuits may be substantially 1 (one).

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
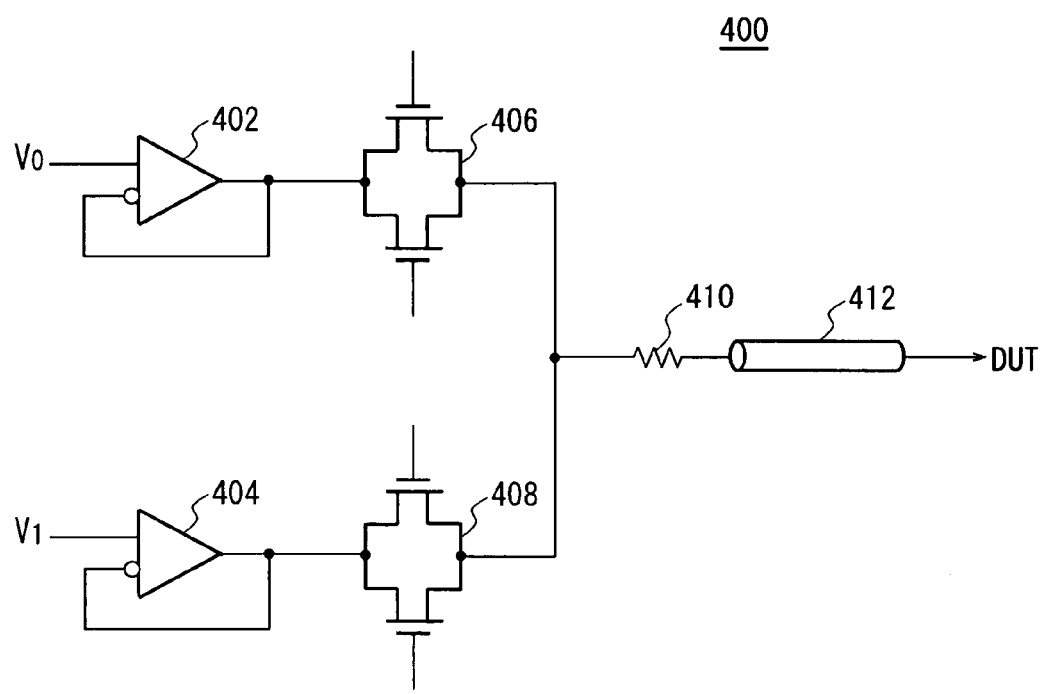
FIG. 1 shows a conventional driver circuit 400.
Figure 2:
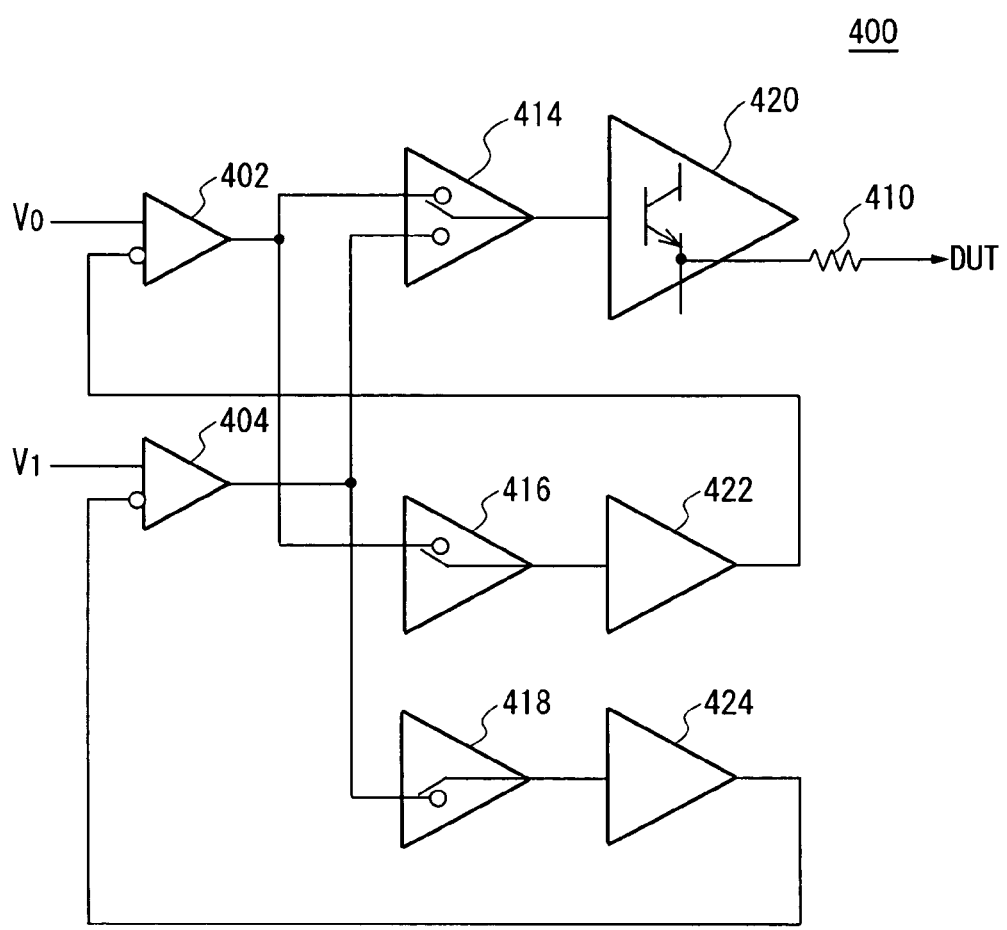
FIG. 2 shows another conventional driver circuit 400.
Figure 3:
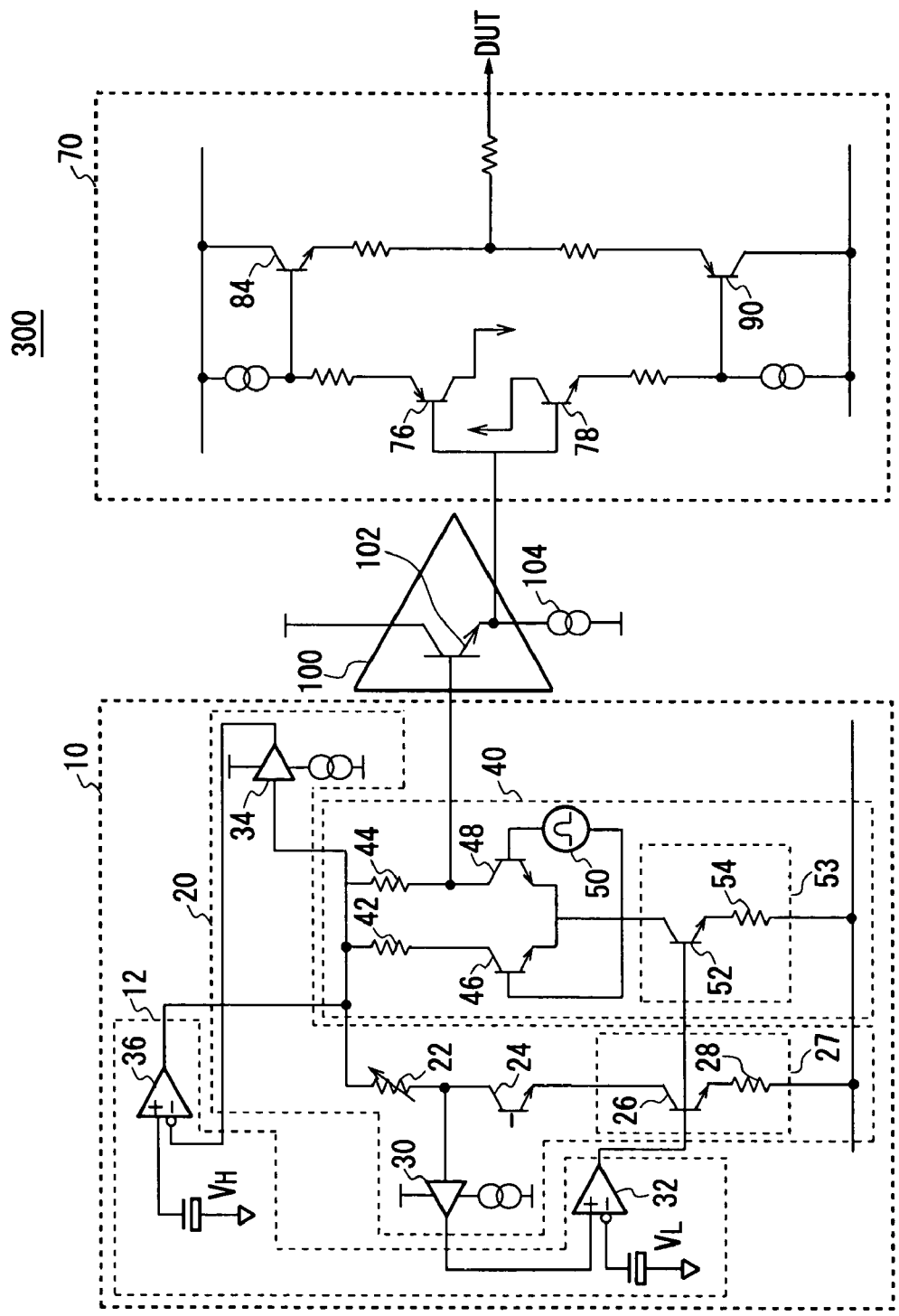
FIG. 3 shows an example of the configuration of a driver circuit 300 according to an exemplary embodiment of the present invention.

FIG. 3 shows an example of the configuration of a driver circuit 300 in relation to the present invention. The driver circuit 300 for outputting an output signal in response to a given input signal includes a pulse generating unit 10, and first and second buffer circuits 100 and 70.

The pulse generating unit 10 receives an input signal, generates a pulse of a voltage corresponding to the input signal, and includes a controlling unit 12, a simulating circuit 20 and a voltage generating unit 40. First, the outline of the driver circuit 300 will be described.

The voltage generating unit 40 outputs a basic output voltage corresponding to the input signal. And, the first buffer circuit 100 outputs its output voltage corresponding to the basic output voltage outputted by the voltage generating unit 40. And, the second buffer circuit 70 whose power consumption is larger than that of the first buffer circuit 100, and whose dependence on temperature is small, generates a voltage corresponding to the output voltage and outputs the voltage as its output signal. In other words, the second buffer circuit 70 allows a less change in its output voltage as time elapses than that of the first buffer circuit 100, and can be operating highly accurately, whereas the first buffer circuit 100 can be operating at lower power consumption than that of the second buffer circuit 70.

And, the simulating circuit 20 includes a simulating buffer circuit of the same characteristics as the first buffer circuit 100, and generates a simulated voltage corresponding to the basic output voltage outputted by the voltage generating unit 40. And, the controlling unit 12 controls the basic output voltage outputted by the voltage generating unit 40 based on the simulated voltage. For example, the controlling unit 12 controls the basic output voltage outputted by the voltage generating unit 40 based on a differential between the simulated voltage and an expected value of the output voltage.

By the above configuration, since a highly accurate buffer circuit can be used as the second buffer circuit 70, and besides the voltage inputted to the second buffer circuit 70 can be adjustable highly accurately, it is possible to generate the output signal whose voltage level can be controlled highly accurately. In addition, since the voltage level is controlled while the output of the simulating circuit is fed back, the voltage change due to the change in temperature inside the chip, etc. as time elapses can be compensated. In addition, since the control is performed by using the simulating circuit of the first buffer circuit 100 whose power consumption is small, both the low power consumption and the highly accurate driver circuit can be realized. In addition, the power consumption of the second buffer circuit 70 becomes large because it is operating highly accurately, and thus the input capacitance becomes large. However, by providing the first buffer circuit 100 between the second buffer circuit 70 and the pulse generating unit 10, the capability to drive the second buffer circuit 70 can be achieved.

In addition, the driver circuit 300 may further include correction means for correcting the error due to the offset voltage or the voltage gain in the second buffer circuit 70. Since such error changes as time elapses, it can be easily corrected by obtaining correction data to perform, e.g. measurement in advance. In addition, the voltage gains of the first and second buffer circuits 100 and 70 may be approximately 1.

Next, the detailed configuration of the driver circuit 300 will be described. The voltage generating unit 40 of the present embodiment includes a resistor 42, an output resistor 44, transistors 46 and 48, an inputting unit 50, and a current supply 53.

The inputting unit 50 receives the input signal, supplies the input signal to the base terminal of the transistor 46, and supplies the inverted input signal to the base terminal of the transistor 48. The transistors 46 and 48 of the substantially same characteristics are arranged in parallel, and are functioning as a differential switch.

The resistor 42 is coupled electrically to the collector terminal of the transistor 46, and the output resistor 44 is coupled electrically to the collector terminal of the transistor 48. One of both the ends of the resistors 42 and 44 that are not coupled to the transistors 46 and 48 is given a voltage that is substantially equal to a standard voltage of H level ($V_H$), i.e. the expected value of the output voltage if the input voltage indicates the H level, via the second operational amplifier 36. In addition, the other end of the output resistor 44 is coupled electrically to the first buffer circuit 100, and outputs the voltage in relation to the other end to the first buffer circuit 100.

In addition, the current supply 53 consisting of a transistor 52 and a resistor 54 is coupled to the emitter terminals of the transistors 46 and 48. The current supply 53 generates a standard current whose magnitude corresponds to the voltage given to the base terminal of the transistor 52, and allows the standard current to flow through either the resistor 42 or 44 in response to the operations of the transistors 46 and 48. The current supply 53 may generate the standard current smaller than the driving current supplied from a current supply 104. And, the collector terminal of the transistor 48 and the first buffer circuit 100 are coupled electrically.

If the voltage of the input signal indicates the H level, the transistor 46 is turned on, whereas the transistor 48 is turned off. Accordingly, the standard current flows through the resistor 42, whereas no currents flow through the output resistor 44, and the first buffer circuit 100 is supplied with the voltage that is substantially equal to the standard voltage of H level. In addition, if the voltage of the input signal indicates the L level, the transistor 46 is turned off, whereas the transistor 48 is turned on. Accordingly, no currents flow through the resistor 42, whereas the standard current flows through the output resistor 44, and the first buffer circuit 100 is supplied with the voltage equivalent to the standard voltage of H level from which the amount of voltage drop across the output resistor 44 is subtracted. In other words, the transistors 46 and 48 are functioning as a switch to perform the control described above. By such operations, the pulse generating unit 10 generates a pulse corresponding to the input signal.

And, the first buffer circuit 100 outputs its output voltage corresponding to the basic output voltage outputted by the voltage generating unit 40. The first buffer circuit 100 may be, e.g. a common collector amplifier circuit. Here, the pulse generating unit 10 adjusts the voltage inputted to the first buffer circuit 100 to output its output voltage that is highly accurate to the first buffer circuit 100.

The simulating circuit 20 includes a simulating buffer circuit of substantially the same characteristics as the first buffer circuit 100, and generates the simulated voltage corresponding to the basic output voltage outputted by the voltage generating unit 40. In this embodiment, the simulating circuit 20 includes first and second simulating buffer circuits 30 and 34, a reference resistor 22, a transistor 24, and a reference current supply 27.

The reference current supply 27 is arranged in parallel to the current supply 53, and generates a reference current whose magnitude is 1/n (where, n is a positive real number) times as much as that of the standard current generated by the current supply 53. In addition, the transistor 24 conducts a current 1/n times as much as the current conducted by the transistor 48. For example, the transistor 24 may be physically 1/n times as large as the size of the transistor 48. It is preferable that the maximum voltage of the input signal may be inputted normally to the base terminal of the transistor 24. In addition, the reference resistor 22 whose resistance is substantially n times as much as that of the output resistance is arranged in parallel to the output resistor 44 with regard to the second operational amplifier 36, and the reference current flows through it, whereby a reference voltage substantially the same as the voltage drop across the output resistor 44 is generated. In other words, the voltage level at the collector terminal of the transistor 24 becomes substantially equal to the voltage level at the collector terminal of the transistor 48. By this configuration, with the power consumption 1/n times as much as that of the voltage generating unit 40, it is possible to generate the voltage that is substantially the same as the basic output voltage generated by the voltage generating unit 40. In addition, if there occurs an error between the reference voltage and the output voltage, the resistance of the reference resistor 22 which is a variable resistor is adjusted, and thereby the error can be reduced.

And, the first simulating buffer circuit 30 is supplied with the reference voltage at the collector terminal of the transistor 24. The first simulating buffer circuit 30 has substantially the same characteristics as the first buffer circuit 100. Accordingly, if the voltage of the input signal indicates the L level, the first simulating buffer circuit 30 can generate a first simulated voltage for simulating the voltage outputted by the first buffer circuit 100 in response to the reference voltage.

The first operational amplifier 32 of the controlling unit 12 controls the magnitude of the standard current generated by the current supply 53 and the reference current generated by the reference current supply 27 based on the differential between the first simulated voltage and the standard voltage of L level ($V_L$), the expected value of the output voltage outputted by the first buffer circuit 100 if the input signal indicates the L level. By such operations, if the input signal indicates the L level, the output voltage outputted by the first buffer circuit 100 can be adjusted highly accurately.

In addition, the second simulating buffer circuit 34 is coupled electrically to one end of the output resistor 44. Since the second simulating buffer circuit 34 has substantially the same characteristics as the first buffer circuit 100, the second simulating buffer circuit 34 outputs a second simulated voltage for simulating the voltage outputted by the first buffer circuit 100.

The second operational amplifier 36 of the controlling unit 12 is given the standard voltage of H level, and supplies the voltage corresponding to the standard voltage of H level to the one end of the output resistor 44. In this embodiment, the second operational amplifier 36 controls the voltage given to the one end of the output resistor 44 based on the differential between the second simulated voltage and the standard voltage of H level. By such operations, if the input signal indicates the H level, the output voltage outputted by the first buffer circuit 100 can be adjusted highly accurately.

And, the second buffer circuit 70 generates the voltage corresponding to the output voltage outputted by the first buffer circuit 100, and outputs the generated voltage as its output voltage. Here, the second buffer circuit 70 is a buffer capable of operating more accurately than the first buffer circuit 100. For example, the second buffer circuit 70 preferably has smaller temperature dependence of the outputted voltage than that of the first buffer circuit 100.

The second buffer circuit 70 in this embodiment includes a plurality of output transistors (84 and 90) for generating their output signals corresponding to the voltages given to their gates, and compensation transistors (76 and 78), which form complementary pairs with the output transistors (84 and 90), for supplying the gates of the output transistors (84 and 90) with the voltages corresponding to the output voltage of the first buffer circuit 100. By this configuration, a buffer whose temperature dependence is small can be used as the second buffer circuit 70. Here, the complementary transistor pair is, e.g. a combination of an NPN transistor and a PNP transistor.

Figure 4:
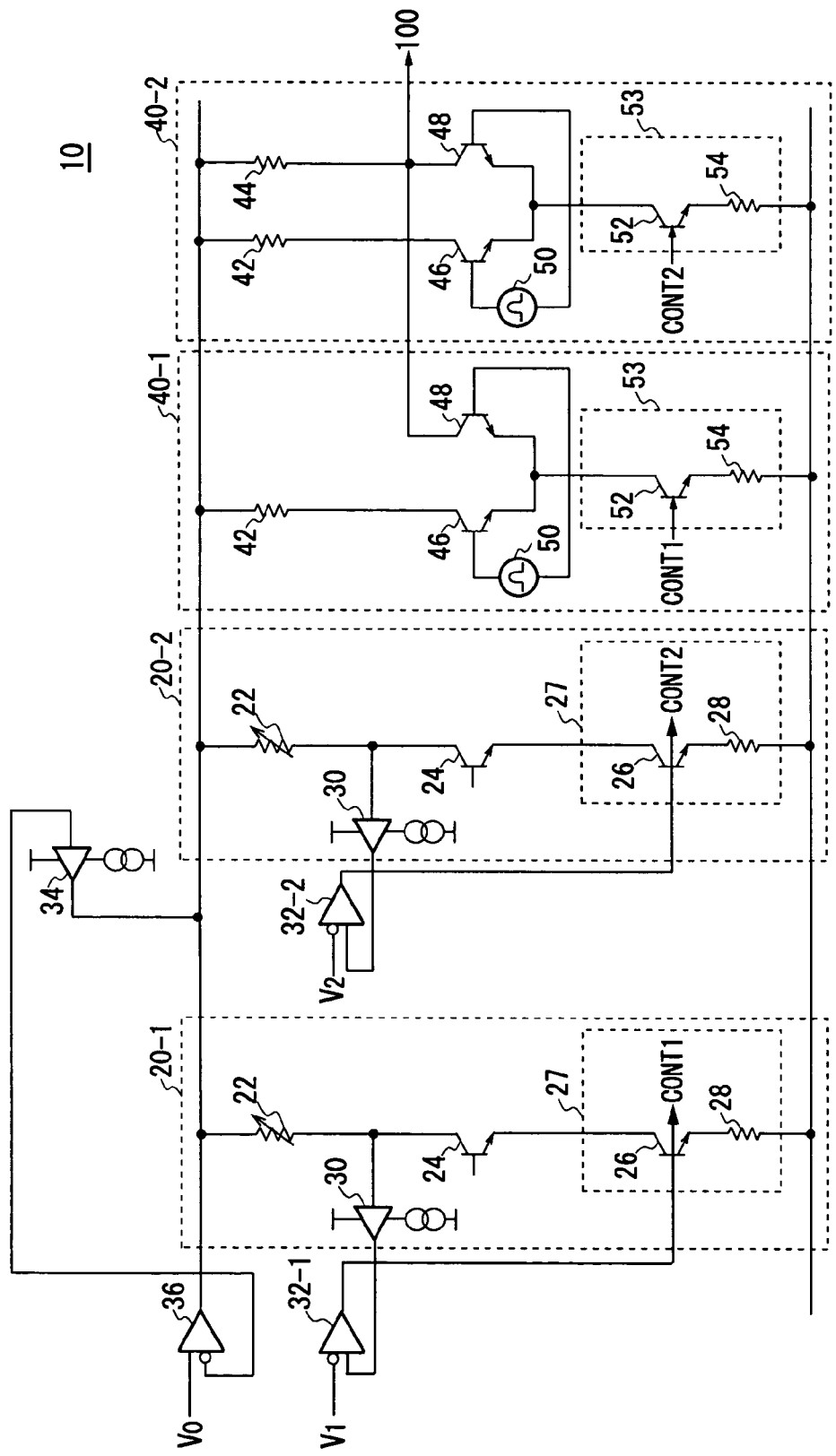
FIG. 4 shows another example of the configuration of the pulse generating unit 10.

FIG. 4 shows another example of the configuration of the pulse generating unit 10. The pulse generating unit 10 in this embodiment generates a pulse of a multi-value voltage level, given three standard voltages ($V_0$, $V_1$ and $V_2$, where $V_0 > V_1 > V_2$) as the expected value of the output voltage outputted by the first buffer circuit 100. The pulse generating unit 10 includes first and second simulating circuits 20-1 and 20-2, first and second voltage generating units 40-1 and 40-2, a second simulating buffer circuit 34, and a controlling unit (not shown) consisting of a plurality of operational amplifiers (36, 32-1 and 32-2). In addition, the elements in FIG. 4 given the same symbols as those in FIG. 3 may have the same configuration and function as those of the elements described in FIG. 3.

The second voltage generating unit 40-2 has the same configuration as that of the voltage generating unit 40 described in relation to FIG. 3. In addition, the first voltage generating unit 40-1 has the same configuration as that of the voltage generating unit 40 described in relation to FIG. 3 except the output resistor 44. The collector terminal of the transistor 48 of the first voltage generating unit 40-1 is coupled electrically to the output resistor 44 of the second voltage generating unit 40-2.

And, the first and second simulating circuits 20-1 and 20-2 have the same configuration as that of the simulating circuit 20 described in relation to FIG. 3 except not having the second simulating buffer circuit 34. Only one second simulating buffer circuit 34, as shown in FIG. 4, is provided to the first and second simulating circuits 20-1 and 20-2.

And, the first operational amplifier 36 is coupled electrically to one end of the output resistor 44 of the second voltage generating unit 40-2, and controls the voltage given to the one end of the output resistor 44. And, the first operational amplifier 32-1 is arranged to correspond to the first simulating circuit 20-1, and controls the reference current generated by the reference current supply 27 of the first simulating circuit 20-1 and the standard current generated by the current supply 53 of the first voltage generating unit 40-1, corresponding to the first simulated voltage outputted by the first simulating buffer circuit 30 of the first simulating circuit 20-1.

And, the first operational amplifier 32-2 is arranged to correspond to the second simulating circuit 20-2, and controls the reference current generated by the reference current supply 27 of the second simulating circuit 20-2 and the standard current generated by the current supply 53 of the second voltage generating unit 40-2, corresponding to the first simulated voltage outputted by the first simulating buffer circuit 30 of the second simulating circuit 20-2.

In such configuration, by inputting an input signal corresponding to the voltage level of the output signal to be outputted to both an inputting part 50 of the first voltage generating unit 40-1 (hereinafter, a first inputting part 50) and an inputting part 50 of the second voltage generating unit 40-2 (hereinafter, a second inputting part 50), the pulse generating unit 10 generates a pulse of a multi-value voltage level. For example, if an input signal of H level is inputted to both the first and second inputting parts 50, both a transistor 48 of the first voltage generating unit 40-1 (hereinafter, a first transistor 48) and a transistor 48 of the second voltage generating unit 40-2 (hereinafter, a second transistor 48) are turned on, and the first buffer circuit 100 is supplied with the voltage corresponding to the standard voltage $V_0$.

In addition, if an input signal of H level is inputted to the first inputting part 50 and an input signal of L level is inputted to the second inputting part 50, only the second transistor 48 is turned on, and the first buffer circuit 100 is supplied with the voltage corresponding to the standard voltage $V_2$. For example, letting the resistance of the output resistor 44 be R, and the standard current generated by the current supply 53 of the second voltage generating unit 40-2 be $I_{L2}$, the voltage of $V_0 - R \times I_{L2}$ is inputted to the first buffer circuit 100.

In addition, if an input signal of L level is inputted to the first inputting part 50 and an input signal of H level is inputted to the second inputting part 50, only the first transistor 48 is turned on, and the first buffer circuit 100 is supplied with the voltage corresponding to the standard voltage $V_1$. For example, letting the standard current generated by the current supply 53 of the first voltage generating unit 40-1 be $I_{L1}$, the voltage of $V_0 - R \times I_{L1}$ is inputted to the first buffer circuit 100.

Figure 5:
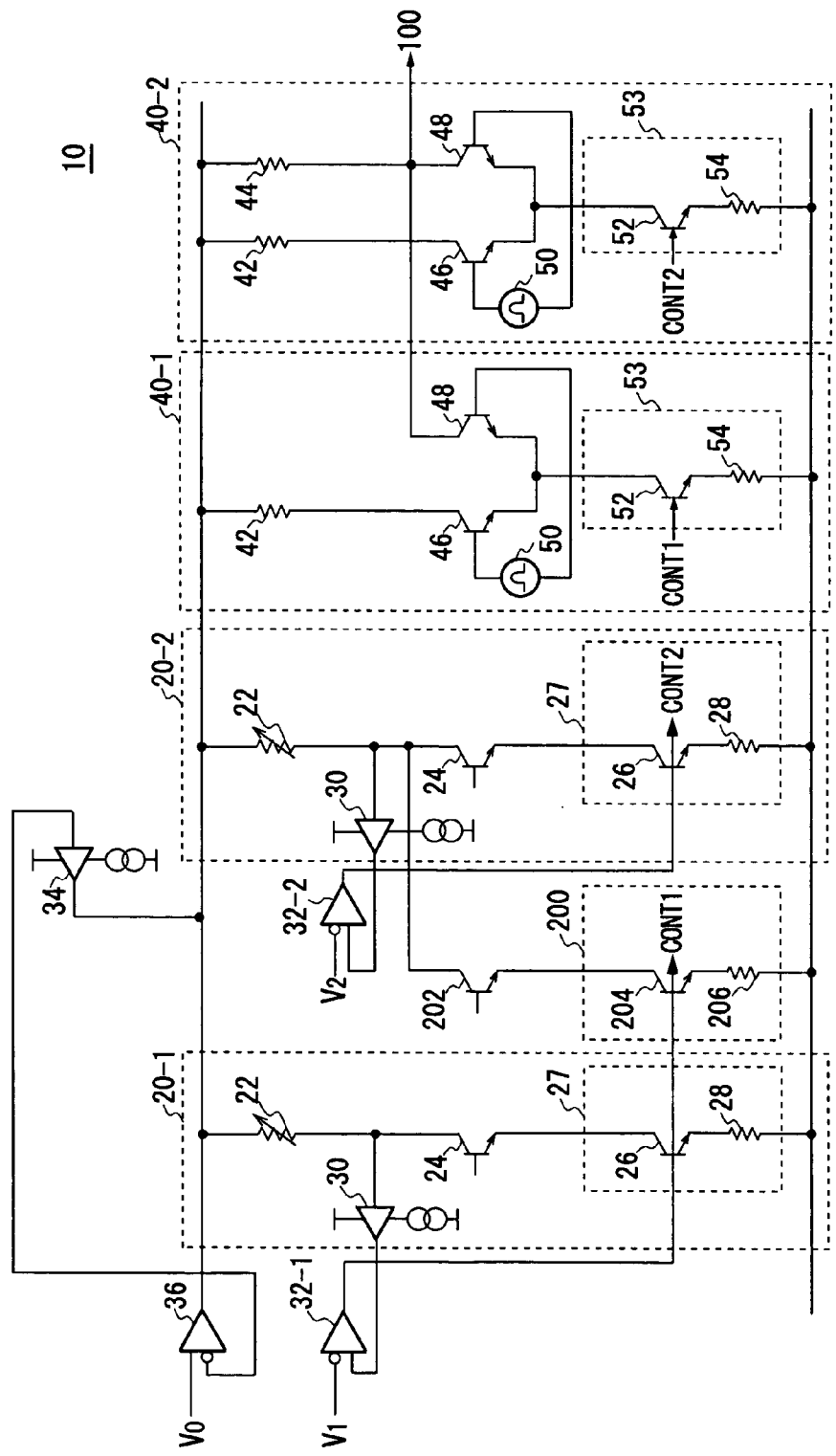
FIG. 5 shows another example of the configuration of the pulse generating unit 10.

FIG. 5 shows another example of the configuration of the pulse generating unit 10. The elements in FIG. 5 given the same symbols as those in FIG. 4 may have the same configuration and function as those of the elements described in FIG. 4. The pulse generating unit 10 in this embodiment, in addition to the configuration of the pulse generating unit 10 described in relation to FIG. 4, further includes a transistor 202 and a current supply 200. The current supply 200 has approximately the same configuration as that of the reference current supply 27, and the base terminal of the transistor 204 receives the voltage outputted by the first operational amplifier 32-1. In other words, the current supply 200 generates the same current as the reference current generated by the reference current supply 27 of the first simulating circuit 20-1.

In addition, the current supply 200 is coupled in parallel to the reference current supply 27 of the second simulating circuit 20-2 with regard to a reference resistor 22 of the second simulating circuit 20-2 (hereinafter, a second reference resistor 22). Letting the standard current generated by the current supply 53 of the first voltage generating unit be $I_{L1}$, and the standard current generated by the current supply of the second voltage generating unit be $I_{L2}$, the current of $I_{L1} + I_{L2}$ flows through the second reference resistor 22.

And, if an input signal of L level is inputted to both the first and second inputting parts 50, both the first and second transistors 48 are turned on, and across the output resistor 44 there occurs the voltage drop caused by the sum of the current flowing through the first transistor 48 and the current flowing through the second transistor 48, and the voltage of $V_0 - R \times (I_{L1} + I_{L2})$ is inputted to the first buffer circuit 100. By this configuration of the pulse generating unit 10, a multi-value output signal can be generated with both low power consumption and high precision.

In other words, if an input signal of L level is inputted to both the first and second inputting parts 50, although the voltage of $V_0 - R \times (I_{L1} + I_{L2})$ is inputted to the first buffer circuit 100, the first operational amplifier 32-2 controls the magnitude of the standard current $I_{L2}$ so that the voltage can be substantially the same as the standard voltage $V_2$. That is, the voltage substantially the same as the standard voltage $V_2$ is inputted to the first buffer circuit 100.

And, if an input signal of L level is inputted to the first inputting part 50 and an input signal of H level is inputted to the second inputting part 50, although the voltage of $V_0 - R \times I_{L1}$ is inputted to the first buffer circuit 100, the first operational amplifier 32-1 controls the voltage to be substantially the same as the standard voltage $V_1$.

And, if an input signal of H level is inputted to both the first and second inputting parts 50, the voltage substantially the same as the standard voltage $V_0$ adjusted by the second operational amplifier 36 is inputted to the first buffer circuit 100. By such configuration, it is possible to generate a multi-value pulse of voltage levels different from that of the pulse generating unit 10 described in FIG. 4.

Figure 6:
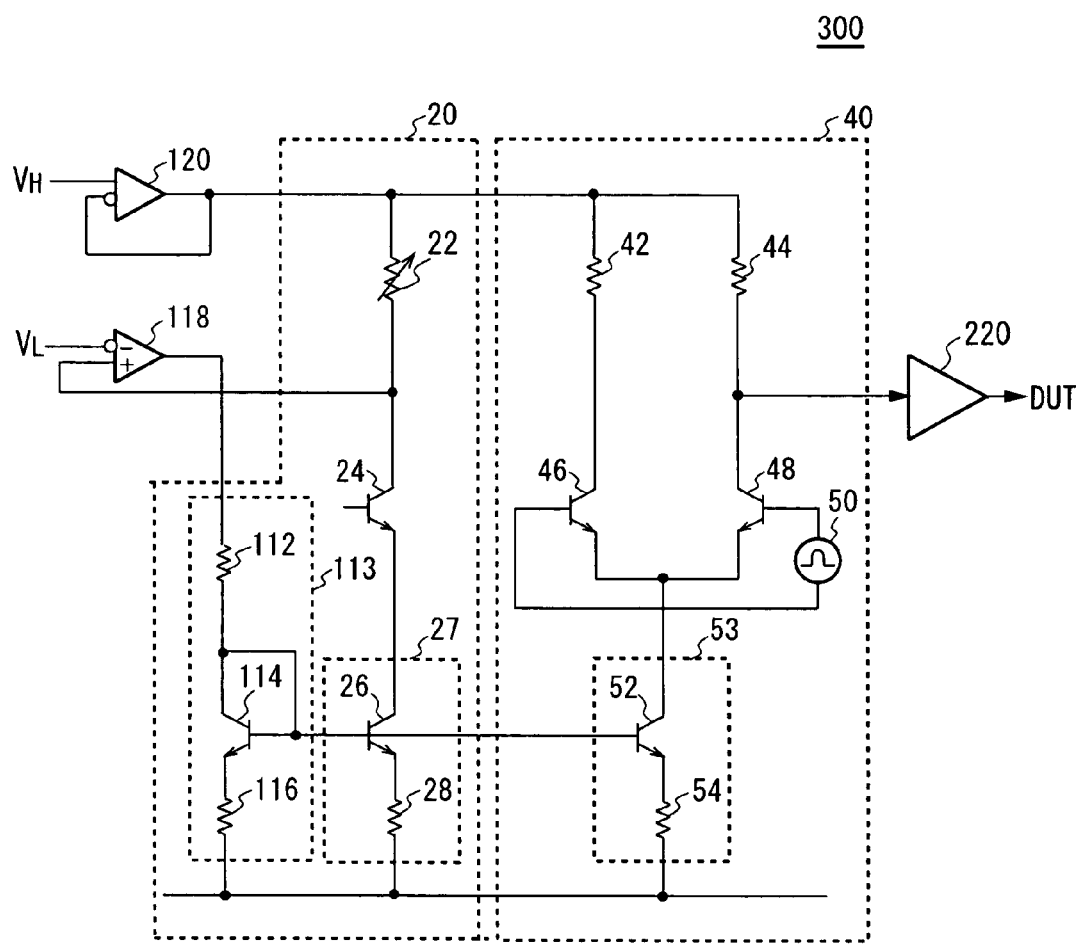
FIG. 6 shows another example of the configuration of a driver circuit 300.

FIG. 6 shows another example of the configuration of the driver circuit 300. The driver circuit 300 in this embodiment includes a pulse generating unit 10 and a buffer circuit 220. The buffer circuit 220 has the same configuration and function as those of the first or second buffer circuit 100 or 70.

The pulse generating unit 10 includes first and second operational amplifiers 118 and 120, a simulating circuit 20 and a voltage generating unit 40. The voltage generating unit 40 has the same configuration and function as those of the voltage generating unit 40 described in FIG. 3. And, the first operational amplifier 118 inputs a standard voltage of H level ($V_H$), which is the expected value of the output voltage outputted by the buffer circuit 220, to one end of the output resistor 44.

The simulating circuit 20 includes a reference resistor 22, a transistor 24, and a reference current supply 27 for simulating the output resistor 44, the transistor 48 and the current supply 53 in the voltage generating unit 40. These elements have the same configuration and function as those of the elements given the same symbols in FIG. 3. In addition, the simulating circuit 20 further includes a base current compensation circuit 113. The base current compensation circuit 113 includes a transistor 114 and a resistor 116 constituting a mirror circuit of the reference current supply 27, and a resistor 112 coupled electrically to the transistor 114 and the first operational amplifier 118.

The base and emitter terminals of the transistor 114 are coupled, and the base terminal is coupled to the base terminal of the transistor 26. By this configuration, it is possible to reduce the error of the output voltage occurring due to the leakage current in the transistor 26.

Figure 7:
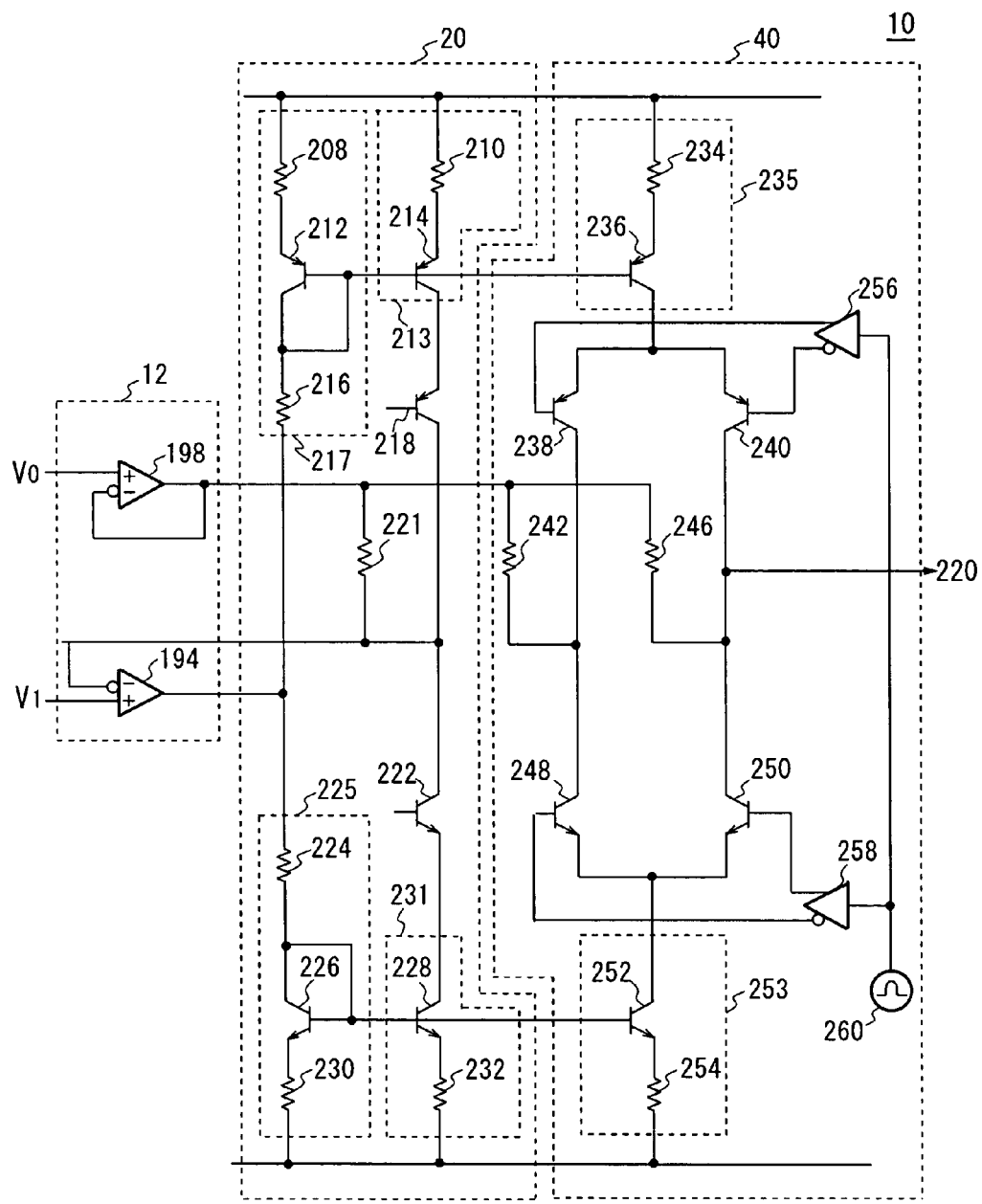
FIG. 7 shows another example of the configuration of the pulse generating unit 10.

FIG. 7 shows another example of the configuration of the pulse generating unit 10. The pulse generating unit 10 includes a controlling unit 12, a simulating circuit 20, and a voltage generating unit 40. The voltage generating unit 40 mainly includes first and second current supplies 235 and 253, a plurality of transistors (238, 240, 248 and 250), a resistor 242, an output resistor 246, and an inputting part 260.

The transistors 238 and 248 are coupled in series between the first and second current supplies 235 and 253, and the transistors 240 and 250 are coupled in parallel to those transistors 238 and 248. The transistors 238 and 240 are, e.g. PNP transistors, and in this case the transistors 248 and 250 are NPN transistors.

The base terminals of the transistors 238 and 240 are given an input signal from the inputting part 260 via a buffer 256, and the base terminals of the transistors 248 and 250 are given the input signal from the inputting part 260 via a buffer 258. In this embodiment, the input signal is given to the transistors 238 and 250, whereas the inverted input signal is given to the transistors 240 and 248. In other words, the transistors 240 and 250 perform their on and off operations in the same way, whereas the transistors 238 and 248 perform their on and off operations in the same way.

One end of the output resistor 246 is coupled between the transistors 240 and 250, whereas the other end of the output resistor 246 is coupled to the second operational amplifier 198. In addition, the one end of the output resistor is further coupled to the buffer circuit 220, and the voltage at the one end is supplied to the buffer circuit 220. The second operational amplifier 198 is a voltage follower circuit to which the standard voltage $V_0$ is given, and supplies the voltage substantially equal to the standard voltage $V_0$ to the other end of the output resistor 246.

In other words, if both the transistors 240 and 250 are turned off, no currents flow through the output resistor 246, and thus the buffer circuit 220 is supplied with the voltage substantially equal to the standard voltage $V_0$. In addition, if both the transistors 240 and 250 are turned on, the current $I_{La}$ generated by the first current supply 235 flows through the transistor 240, whereas the current $I_{Lb}$ generated by the second current supply 253 flows through the transistor 250. Accordingly, the current equivalent to the differential between them flows through the output resistor 246, and the direction of this current is determined by the magnitude relation between the currents $I_{La}$ and $I_{Lb}$. For example, if $I_{La} > I_{Lb}$, the reverse current flows through the output resistor 246, and the voltage equivalent to the increment from the standard voltage $V_0$ is supplied to the buffer circuit 220. The magnitude of these currents $I_{La}$ and $I_{Lb}$ is determined by the voltage inputted to the base terminal of the transistors 236 and 254.

The simulating circuit 20 includes first and second reference current supplies 213 and 231, first and second base current compensation circuits 217 and 225, transistors 218 and 222, and a resistor 221. The first and second reference current supplies 213 and 231 have the same configuration and function as those of the reference current supply 27 described in FIG. 6. In addition, the first and second base current compensation circuits 217 and 225 have the same configuration and function as those of the base current compensation circuit 113 described in FIG. 6.

The first reference current supply 213, the transistors 218 and 222, and the second reference current supply 231 become the simulating circuits of the first current supply 235, the transistors 240 and 250, and the second current supply 253 respectively, and are coupled in series. In addition, the transistors 218 and 222 are given the base voltage to be turned on normally.

And, the first base current compensation circuit 217 and 225 are arranged in parallel to the first and second reference current supplies 213 and 231 respectively. In addition, the resistor 221 is functioning as the simulating circuit of the output resistor 246, and one end thereof is coupled between the transistors 218 and 222, whereas the other end thereof is coupled to the second operational amplifier 198. And, the first operational amplifier 194 is given the standard voltage $V_1$, and outputs the current corresponding to the differential between the standard voltage $V_0$ given via the resistor 221 and the standard voltage $V_1$ to the route coupled to both the fist and second base current compensation circuits 217 and 225.

Here, if $V_0 < V_1$, the current flowing through the first base current compensation circuit 217 is increased, whereas the current flowing through the second base current compensation circuit 225 is decreased. Accordingly, $I_{La} > I_{Lb}$, and the voltage equivalent to the increment from the standard voltage $V_0$ is supplied to the buffer circuit 220.

On the other hand, if $V_0 > V_1$, then $I_{La} < I_{Lb}$, and the voltage equivalent to the decrement from the standard voltage $V_0$ is supplied to the buffer circuit 220. As described above, according to this embodiment, by controlling the magnitude of $V_0$ and $V_1$ given as the standard voltage, it is possible to generate a pulse having a variety of voltage levels.

Figure 8:
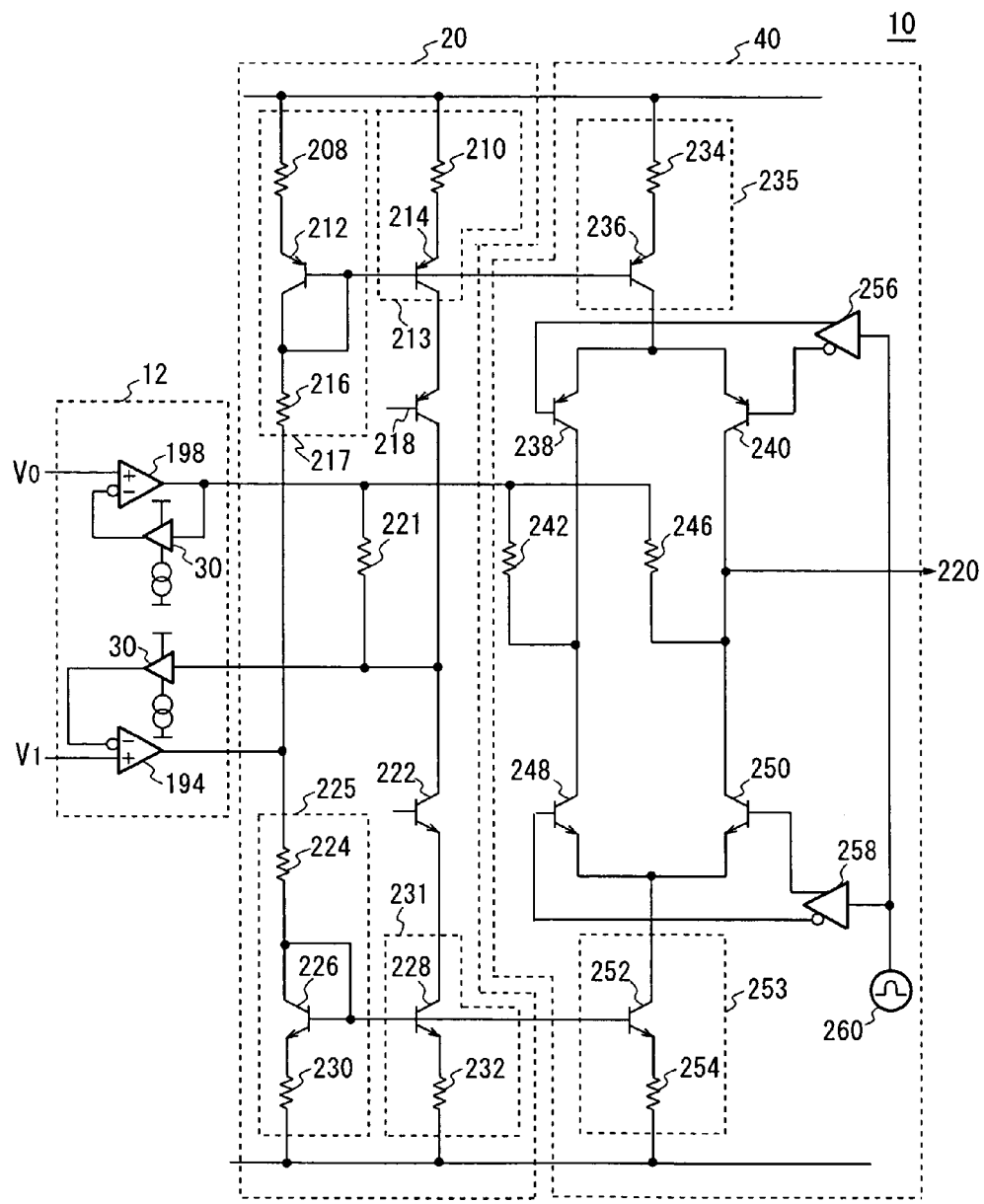
FIG. 8 shows another example of the configuration of the pulse generating unit 10.

FIG. 8 shows another example of the configuration of the pulse generating unit 10. The pulse generating unit 10 in this embodiment, in addition to the configuration of the pulse generating unit 10 described in FIG. 7, further includes first simulating buffer circuits 30. The first simulating buffer circuit 30 may have the same configuration and function as those of the first simulating buffer circuit 30 described in relation to FIG. 4.

Both the first simulating buffer circuits 30 are arranged at the first and second operational amplifiers 194 and 198 respectively, and the voltages outputted by the corresponding operational amplifiers are fed back to the input terminals of the operational amplifiers respectively. By such configuration, the pulse generating unit 10 can be operating highly accurately.

Although the present invention has been described by way of exemplary embodiments, it should be understood that those skilled in the art might make many changes and substitutions without departing from the spirit and the scope of the present invention, which is defined only by the appended claims.

As is obvious from the description above, according to the present invention, it is possible to provide a driver circuit with low power consumption and high voltage precision.

What is claimed is:

1. A driver circuit for outputting an output signal corresponding to an input signal given to said driver circuit, comprising:
   a voltage generating unit for outputting a basic output voltage corresponding to said input signal;
   a first buffer circuit for outputting an output voltage corresponding to said basic output voltage outputted by said voltage generating unit;
   a second buffer circuit, of which power consumption is larger than said first buffer circuit, for generating and outputting a voltage corresponding to said output voltage as said output signal;
   a simulating circuit comprising a simulating buffer circuit for generating a simulated voltage corresponding to said basic output voltage outputted by said voltage generating unit, said simulating buffer circuit having substantially the same characteristic as that of said first buffer circuit; and
   a controlling unit for controlling said basic output voltage outputted by said voltage generating unit based on said simulated voltage,
   wherein the basic output voltage is controlled by said controlling unit while the simulated voltage is fed back to said controlling unit, and an output of said voltage generating unit is inputted into said simulating circuit.

2. The driver circuit as claimed in claim 1, wherein said second buffer circuit has less temperature dependence of outputted voltage than that of said first buffer circuit.

3. The driver circuit as claimed in claim 2, wherein said controlling unit controls said basic output voltage outputted by said voltage generating unit based on a differential between said simulated voltage and an expected value of said output voltage.

4. The driver circuit as claimed in claim 3, wherein
   said first buffer circuit is a common collector amplifier circuit, and
   said second buffer circuit comprises:
      an output transistor for generating said output signal corresponding to a voltage given to a gate thereof; and
      a compensation transistor for supplying said gate of said output transistor with said voltage corresponding to said output voltage outputted by said first buffer circuit, said compensation transistor forming a complementary pair with said output transistor.

5. The driver circuit as claimed in claim 3, wherein
   said voltage generating unit comprises:
      a current supply for generating a standard current;
      an output resistor, of which a first end is given a standard voltage of H level which is an expected value if said input signal indicates said H level, and a second end outputs said basic output voltage to said first buffer circuit; and
      a switch for preventing said standard current from flowing through said output resistor and supplying said standard voltage of H level to said first buffer circuit if said input signal indicates said H level, whereas said switch allows said standard current to flow through said output resistor and supplies a drop voltage equivalent to a voltage drop from said standard voltage of H level to said first buffer circuit if said input signal indicates an L level,
   said simulating circuit comprises:
      a first simulating buffer circuit for generating a first simulated voltage corresponding to said drop voltage, said first simulating buffer circuit having substantially the same characteristic as that of said first buffer circuit, and
   said controlling unit comprises:
      a first operational amplifier for controlling magnitude of said standard current generated by said current supply based on a differential between said first simulated voltage and a standard voltage of L level which is an expected value of said output voltage if said input signal indicates said L level.

6. The driver circuit as claimed in claim 5, wherein
   said controlling unit further comprises:
      a second operational amplifier for supplying a voltage corresponding to said standard voltage of H level to said first end of said output resistor, when said standard voltage of H level is given,
   said simulating circuit further comprises:
      a second simulating buffer circuit for generating a second simulated voltage corresponding to said voltage given to said first end of said output resistor, said second simulating buffer circuit having substantially the same characteristic as that of said first buffer circuit, and
   said second operational amplifier controls said voltage given to said first end of said output resistor based on a differential between said second simulated voltage and said standard voltage of H level.

7. The driver circuit as claimed in claim 6, wherein
   said simulating circuit further comprises:
      a reference current supply arranged in parallel to said current supply for generating a reference current, of which magnitude is 1/n (where n is a positive real number) times as much as that of said standard current; and
      a reference resistor, of which resistance is n times as much as that of said output resistor, for generating a reference voltage substantially the same as said drop voltage when said reference current flows through said reference resistor, said reference resistor being arranged in parallel to said output resistor with regard to said second operational amplifier,
   said first simulating buffer circuit generates said first simulated voltage corresponding to said reference voltage, and
   said controlling unit further controls magnitude of said reference current generated by said reference current supply based on said differential between said first simulated voltage and said standard voltage of L level.

8. The driver circuit as claimed in claim 5, wherein said current supply generates said standard current which is smaller than a first driving current.

9. The driver circuit as claimed in claim 3, wherein voltage gains of said first and second buffer circuits are substantially 1 (one).

* * * * *